US009577223B2

(12) United States Patent
Shin et al.

(10) Patent No.: US 9,577,223 B2
(45) Date of Patent: Feb. 21, 2017

(54) ORGANIC LIGHT EMITTING DIODE WITH LIGHT-SCATTERING LAYER WITH NANO STRUCTURE AND AIR GAPS

(71) Applicant: Electronics and Telecommunications Research Institute, Daejeon (KR)

(72) Inventors: Jin Wook Shin, Daejeon (KR); Jeong Ik Lee, Daejeon (KR); HongKyw Choi, Daejeon (KR); Jaehyun Moon, Daejeon (KR); Jonghee Lee, Daejeon (KR); Nam Sung Cho, Daejeon (KR); Doo-Hee Cho, Daejeon (KR); Chul Woong Joo, Seoul (KR); Jun-Han Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/662,653

(22) Filed: Mar. 19, 2015

(65) Prior Publication Data
US 2015/0340659 A1    Nov. 26, 2015

(30) Foreign Application Priority Data

May 22, 2014 (KR) .................. 10-2014-0061352

(51) Int. Cl.
*H01L 51/52* (2006.01)
*H01L 51/56* (2006.01)
(52) U.S. Cl.
CPC .......... *H01L 51/5268* (2013.01); *H01L 51/56* (2013.01)

(58) Field of Classification Search
CPC ...... H01L 51/56; H01L 51/5268; H01L 51/52; H01L 51/5203; H01L 51/5275
USPC .............................. 257/40, E51.019; 438/29
See application file for complete search history.

(56) References Cited

U.S. PATENT DOCUMENTS

| 8,685,768 B2 | 4/2014 | Huh et al. |
| 2007/0252155 A1* | 11/2007 | Cok ..................... H01L 51/5203 257/79 |
| 2012/0305966 A1 | 12/2012 | Shin |
| 2013/0050103 A1* | 2/2013 | Song ....................... G06F 3/041 345/173 |

FOREIGN PATENT DOCUMENTS

KR    10-2012-0133961 A    12/2012

* cited by examiner

*Primary Examiner* — Selim Ahmed
(74) *Attorney, Agent, or Firm* — Rabin & Berdo, P.C.

(57) ABSTRACT

Provided is an organic light emitting diodes (OLED) and method of manufacturing the OLED. The OLED includes: a substrate; a light scattering layer having an uneven shape on the substrate; a transparent electrode film provided directly on and in contact with the light scattering layer; an organic light emitting layer on the transparent electrode film; and an electrode on the organic light emitting layer. The method of manufacturing the OLED includes: disposing a light scattering layer on a substrate; providing a transparent electrode film on the light scattering layer; and transferring the transparent electrode film to be directly on and in contact with the light scattering layer.

6 Claims, 4 Drawing Sheets

ORGANIC LIGHT EMITTING DIODE WITH LIGHT-SCATTERING LAYER WITH NANO STRUCTURE AND AIR GAPS

CROSS-REFERENCE TO RELATED APPLICATIONS

This U.S. non-provisional patent application claims priority under 35 U.S.C. §119 of Korean Patent Application No. 10-2014-0061352, filed on May 22, 2014, the entire contents of which are hereby incorporated by reference.

BACKGROUND OF THE INVENTION

The present invention disclosed herein relates to an organic light emitting diode and a method of manufacturing the same.

An organic light emitting diode (OLED) is a self light emitting element that electrically excites an organic light emitting substance to emit light. The OLED includes a substrate, a first electrode, a second electrode, and an organic light emitting layer disposed between the first electrode and the second electrode. The organic light emitting layer generates light by the combination of holes and electrons supplied from the first and second electrodes. The OLED is a device emitting light for itself and has a wide viewing angle, a rapid response speed and high colorgamut. The OLED is being applied to a display device. In recent, a research on applying the OLED to lighting is being conducted.

The OLED includes components, such as a substrate, a light scattering layer and an organic light emitting layer that are stacked. Light generated at the organic light emitting layer is visually perceived only when the light passes through the interface between different kinds of substances and substance layers having different refractive indexes. Due to the interface between the different kinds of substances and the different refractive indexes, generated light is optically guided or experiences total internal reflection. Because of such an optical structure, most of the light generated by the OLED is lost. Only a small fraction (up to about 20%) of the generated light is generated from an element and visually perceived from the outside.

SUMMARY OF THE INVENTION

The present invention provides an organic light emitting diode and method of manufacturing the same that increase light extraction efficiency.

Embodiments of the present invention provide organic light emitting diodes (OLED) including: a substrate; a light scattering layer having an uneven shape on the substrate; a transparent electrode film provided directly on and in contact with the light scattering layer; an organic light emitting layer on the transparent electrode film; and an electrode on the organic light emitting layer.

In some embodiments, the light scattering layer may include nano structures and air gaps between the nano structures. Widths of the nano structures may be about 50 nm to about 3000 nm and distances between the nano structures may be about 50 nm to about 3000 nm.

In other embodiments, the transparent electrode film may include at least one of conducting polymer, conductive oxide, carbon-based substance and metallic substance. The conducting polymer may include at least one of poly (3,4-ethylenedioxythiophene), poly (4-styrenesulfonate), polyacetylene, poly (p-Phenylene), polythiophene, poly (ethylenedioxythiophene), polypyrrole, poly (p-phenylene vinylene), poly (thienylene vinylene), polyaniline, polyisothianaphthene, and poly (p-phenylene sulfide). The conductive oxide may include at least one of indium tin oxide (ITO) and indium zinc oxide (IZO).

In still other embodiments, the transparent electrode film may include at least one of graphene, molybdenum disulfide ($MoS_2$) and tungsten sulfide ($WS_2$).

In other embodiments of the present invention, methods of manufacturing an OLED include: forming a light scattering layer on a substrate; providing a transparent electrode film on the light scattering layer; and transferring the transparent electrode film to be directly on and in contact with the light scattering layer.

In some embodiments, the transparent electrode film may include at least one of graphene, molybdenum disulfide ($MoS_2$) and tungsten sulfide ($WS_2$).

In other embodiments, the transferring of the transparent electrode film may include providing the transparent electrode film directly on and in contact with the light scattering layer and performing heat treatment.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
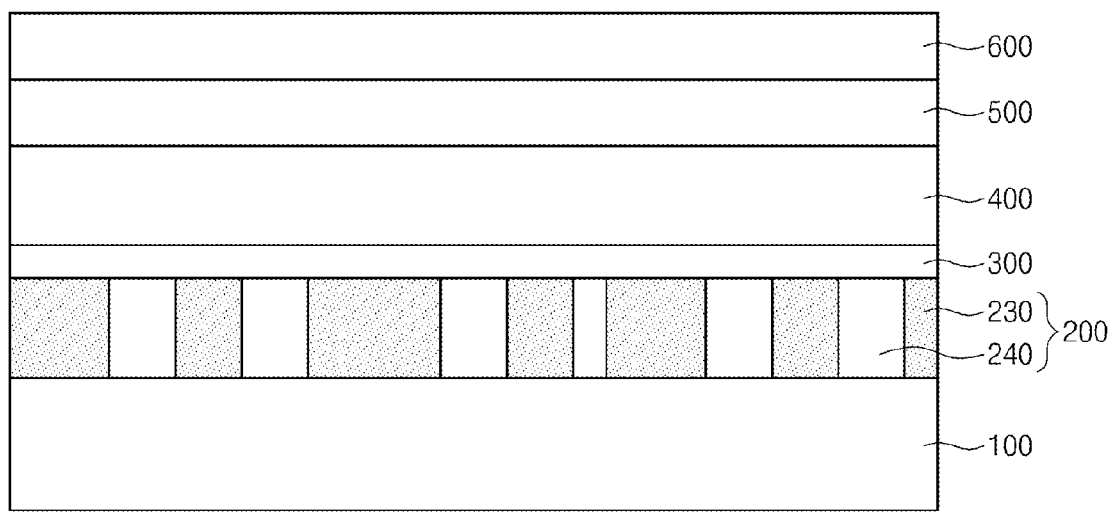
FIG. 1 is a cross-sectional view of an organic light-emitting diode (OLED) according to an embodiment of the present invention.

The effects and features of the present invention, and implementation methods thereof will be clarified through following embodiments to be described in detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to a person skilled in the art to which the present invention pertains. Further, the present invention is only defined by scopes of claims. The same reference numerals throughout the disclosure refer to the same components.

Also, embodiments in the present disclosure are described with reference to ideal, exemplary cross sectional views and/or plan views of the present invention. The thicknesses of layers and regions in the drawings are exaggerated for the effective description of technical content. Thus, the forms of exemplary views may vary depending on manufacturing technologies and/or tolerances. Thus, embodiments of the present invention are not limited to shown specific forms and also include variations in form produced according to manufacturing processes. For example, an etch region shown as a rectangular shape may have a round shape or a shape having a certain curvature. Thus, regions illustrated in the drawings are exemplary, and the shapes of the regions illustrated in the drawings are intended to illustrate the specific shapes of the regions of elements and not to limit the scope of the present invention.

FIG. 1 is a cross-sectional view of an organic light-emitting diode (OLED) according to an embodiment of the present invention.

Referring to FIG. 1, a light scattering layer 200, a transparent electrode film 300, an organic light emitting layer 400, an electrode 500, and a protective layer 600 may be sequentially disposed on a substrate 100.

The substrate 100 may transmit light. The substrate 100 may be an inorganic substrate. For example, the substrate 100 may include at least one of silicon oxide ($SiO_2$), silicon nitride (SiN), silicon (Si), and titanium oxide ($TiO_2$). The substrate 100 may be an organic substrate. For example, the substrate 100 may include at least one of polyimide), polyethylene terephthalate (PET) and/or polyacrylate.

The light scattering layer 200 may be provided on the substrate 100. The light scattering layer 200 may include nano structures 230. The nano structures 230 may be about 50 nm to about 3000 nm. The distance between the nano structures 230 may be about 50 nm to about 3000 nm and there may be irregular widths and distances. For example, the nano structures 230 may have a circle shape, an ellipse shape, a capsule shape, or a circular concave shape. The nano structures 230 may include at least one of transparent materials. For example, the nano structures 230 may include at least one of oxide such as $SiO_2$, $SnO_2$, $TiO_2$, $TiO_2$—$SiO_2$, $ZrO_2$, $Al_2O_3$, $HfO_2$, $In_2O_3$, or ITO, nitride such as SiNx, and a resin such as a polyethylene, polyacrylate, or polyvinyl chloride (PVC) resin, a polyvinylpyrrolidone resin, or a polyimide, polystyrene, or epoxy resin. The light scattering layer 200 may further include an air gap 240 between the nano structures 230.

The irregularly uneven structure of the light scattering layer 200 may work as a light scattering element. The irregularly uneven structure of the light scattering layer 200 has an irregular shape, size (height or diameter) and/or arrangement. The light scattering layer 200 may perform scattering, reflection, scattered refraction and diffraction on incident light without dependence on a specific wavelength. The light scattering layer 200 may be effective in enhancing light extraction efficiency. Thus, it is possible to enhance the light extraction efficiency of the OLED 1. As another example, the light scattering layer 200 may have regular structure.

The transparent electrode film 300 is located on the nano structures 230. The transparent electrode film 300 may be an anode electrode. The transparent electrode film 300 may receive a voltage from the outside to supply a hole to the organic light emitting layer 400. The transparent electrode film 300 includes at least one of oxide-based, polymer-based, carbon-based substance, a metallic substance and synthesized polymer. Conducting polymer may include poly (3,4-ethylenedioxythiophene):poly(4-styrenesulfonate) (PEDOT:PSS), polyacetylene, poly(p-phenylene), polythiophene, poly(ethylenedioxythiophene), polypyrrole, poly(p-phenylene vinylene), poly(thienylene vinylene), polyaniline, polyisothianaphthene, and poly(p-phenylene sulfide). Transparent conductive oxide (TCO) may include indium tin oxide (ITO) and indium zinc oxide ((IZO). The transparent electrode film 300 may include a transparent electrode such as graphene, molybdenum disulfide ($MoS_2$) and tungsten sulfide ($WS_2$) that is 2-dimensionally formed.

The organic light emitting layer 400 may be provided on the transparent electrode film 300. The organic light emitting layer 400 may generate light through the recombination of holes supplied from the transparent electrode film 300 and electrons supplied from the electrode 500. It is also possible to further include a secondary layer (not shown) increasing the light emitting efficiency of the organic light emitting layer 400. The secondary layer may include at least one of a hole injecting layer, a hole transfer layer, an electron transfer layer and an electron injecting layer. The organic light emitting layer 400 may include at least one of organic light emitting substances. For example, the organic light emitting layer 400 may include at least one of a polyfluorene derivative, a (poly) paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative and carbazole. According to other embodiments, the organic light emitting layer 400 may be an organic light emitting substance including a dopant. For example, the dopant may include at least one of xanthene, perylene, cumarine, rhodamine, rubrene, dicyanomethylenepyran, thiopyran, (thia) pyrilium, a periflanthene derivative, an indenoperylene derivative, carbostyryl, nile red, and quinacridone. The organic light emitting substance may include at least one of a polyfluorene derivative, a (poly) paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative and carbazole.

The electrode 500 may be provided on the organic light emitting layer 400. The electrode 500 may be a cathode. The electrode 500 may receive a voltage from the outside to supply an electron to the organic light emitting layer 400. The electrode 500 may transmit light generated from the organic light emitting layer 400 or reflect the light to the transparent electrode film 300. The electrode 500 may include a conductive material. The electrode 500 may be a metallic or optically transparent conductive material. For example, metal may be aluminum (Al), silver (Ag), magnesium (Mg), molybdenum (Mo) or alloy thereof. The transparent electrode film 500 may include a transparent electrode such as graphene, molybdenum disulfide ($MoS_2$) and tungsten sulfide ($WS_2$) that is 2-dimensionally formed. The optically transparent conductive material may include a metallic thin film. The wavelength of light passing through the thin film may vary depending on the thickness of the thin film.

The protective layer 600 may be provided on the electrode 500. The protective layer 600 may be a sealed protective layer and a packaged glass plate. The protective layer 600 may include an air blocking material. The protective layer 600 may include a transparent material. The protective layer 600 protects the organic light emitting layer 400. The protective layer 600 may include organic film and 2-dimesional material such as molybdenum disulfide ($MoS_2$) and tungsten sulfide ($WS_2$)

FIGS. 2 to 7 are cross-sectional views of a manufacturing method of an OLED according to an embodiment of the present invention.

Figure 2:
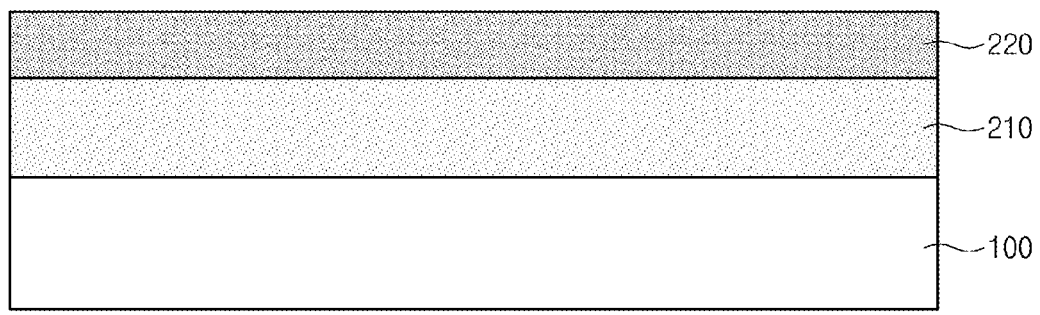
FIGS. 2 to 7 are cross-sectional views of a method of manufacturing an OLED according to an embodiment of the present invention.

Referring to FIG. 2, a light-scattering medium layer 210 and a metallic thin film layer 220 are sequentially formed on the substrate 100. The substrate 100 may be washed before forming the light-scattering medium layer 210. Washing may be performed by distilled water, organic solvent, base solution and acid solution. The light-scattering medium layer 210 may be formed by deposition. For example, the light-scattering medium layer 210 may be formed by sputtering, chemical vapor deposition (CVD), E-beam evaporation, thermal evaporation and/or atomic layer deposition (ALD). The light-scattering medium layer 210 may include at least one of oxide such as $SiO_2$, $SnO_2$, $TiO_2$, $TiO_2$—$SiO_2$, $ZrO_2$, $Al_2O_3$, $HfO_2$, $In_2O_3$, or ITO, nitride such as SiNx, and a resin such as a polyethylene, polyacrylate, or polyvinyl chloride (PVC) resin, a polyvinylpyrrolidone (PVP) resin, or a polyamide, polystyrene, or epoxy resin. The light-scattering medium layer 210 may include a substance having the same or a higher refractive index than the substrate 100. According to other embodiments, The light-scattering medium layer 210 may be omitted. For example, the light-scattering medium layer 210 may be formed to have a thickness of about 50 nm to about 1000 nm.

The metallic thin film layer 220 may be formed on the light-scattering medium layer 210. The metallic thin film layer 220 may be formed by deposition and coating. For example, the metallic thin film layer 220 may be formed by sputtering, chemical vapor deposition (CVD), E-beam evaporation, thermal evaporation and atomic layer deposition (ALD). The metallic thin film layer 220 may include a material resistant to dry etching. For example, the metallic thin film layer 220 may include at least one of metal (e.g., platinum (Pt), gold (Au), silver (Ag), copper (Cu), nickel (Ni), chrome (Cr), tungsten (W), zinc (Zn), tin (Sn), titanium (Ti), zirconium (Zr), aluminum (Al), and/or combinations thereof), photoresist (e.g., poly (methyl methacrylate), (PMMA), poly (dimethylglutarimide (PMGI), or SU-8), a ceramic material (e.g., Al2O3) and/or an organic compound. When the thickness of the metallic thin film layer 220 is thin, the metallic thin film layer 220 may be deposited in an island form without forming a layer. For example, the metallic thin film layer 220 may be formed to have a thickness of about 10 nm to about 100 nm.

Figure 3:
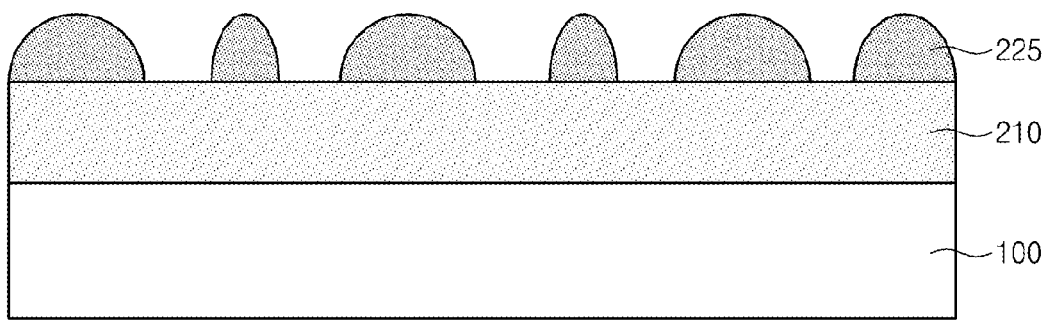

Referring to FIG. 3, an etching mask 225 is formed. As an example, the etching mask 225 may be formed through thermal treatment on the metallic thin film layer 220. The etching mask 225 has an irregular pattern by dewetting. The dewetting means having an irregular pattern partially concave or convex in a state in which a substance having a dewetting property is uniformly applied. The etching mask 225 may expose a portion of the light-scattering medium layer 210. For a thermal treatment process, an oven or hot plate is used. The thermal treatment process may be performed by thermal annealing or rapid thermal annealing (RTA). The thermal treatment process may be performed at a point lower than or equal to a softening point of the substrate 100. For example, the thermal treatment may be performed at room temperature to a temperature of 250° C. The etching mask 225 may have an irregular size and arrangement. The average diameter and thickness of the etching mask 225 may be adjusted. For example, the etching mask 225 may have a size of about 100 nm to about 1000 nm. The etching mask 225 may have a thickness of about 10 nm to about 500 nm.

Figure 4:
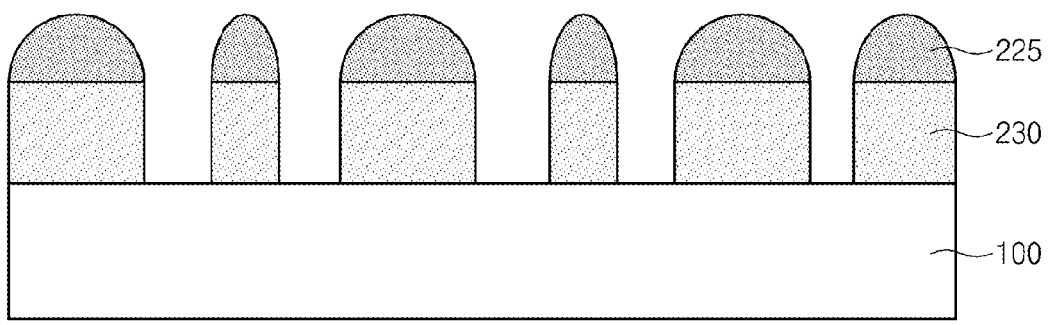

Referring to FIG. 4, the nano structure 230 may be formed through a dry etching process using a reactive ion etching (RIE) or a inductively coupled plasma (ICP) by the etching mask 225 as an etch mask. The light-scattering medium layer 210 exposed by the etching mask 225 may become the nano structure 230 having an irregular pattern by etching. For example, the cross sections of the nano structures 230 may be in quadrilateral, trapezoidal, and circular shapes.

As another example, the nanostructure 230 may be formed through an imprint lithography method. After manufacturing a mold having the shape of the nano structure 230, it is possible to form the nano structure 230 by applying heat and pressure to a polymer layer coated on the substrate.

As still another example, the substrate 100 is coated with a bead or nano wire having a higher etching selectivity ratio than the substrate 100 or the light-scattering medium layer 210. The substrate 100 is etched by using a coated bead or nano wire as an etching mask. It is possible to form the nano structure 230 by removing the etching mask.

Figure 5:
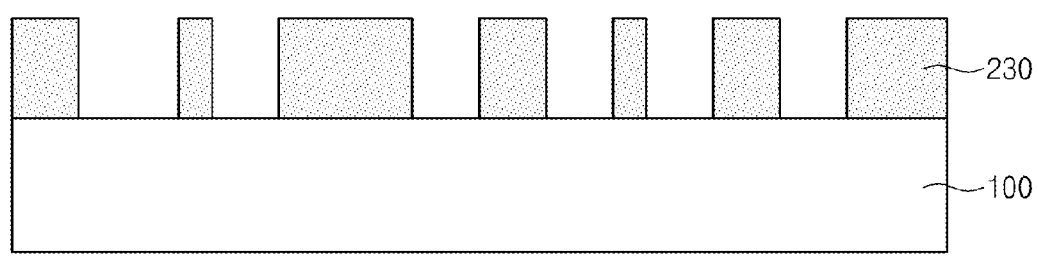

Referring to FIG. 5, the etching mask 225 may be removed. The etching mask 225 may be removed by the acid. For example, the acid may include nitric acid ($HNO_3$), sulfuric acid ($H_2SO_4$), aquaregia ($HCl:HNO_3$), and phosphoric acid ($H_3PO_4$). It is possible to remove the etching mask without destroying the nano structure 230 by using the acid.

Figure 6:
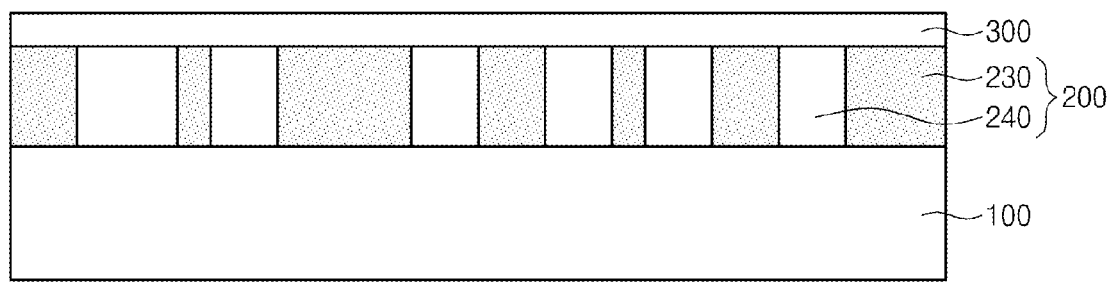

Referring to FIG. 6, the transparent electrode film 300 is transferred onto the nano structure 230. The transparent electrode film 300 is positioned directly on and in contact with the nano structure 230. The transparent electrode film 300 is transferred through thermal treatment. By the forming of the transparent electrode film 300, an air gap 240 is formed in the light scattering layer 200. Planarization is performed by the direct transferring of the transparent electrode film 300 onto the nano structure 230 without a planarization layer process. It is possible to decrease light loss due to a planarization layer by forming the transparent electrode film 300 without the planarization layer. It is possible to optimize a difference in refractive index by a light extraction structure including the substrate 100, the transparent electrode film 300, the nano structure 230 and the air gap 240 (having a refractive index of 1). Thus, it is possible to increase light extraction efficiency.

The transparent electrode film 300 may be made from graphene. When the graphene is used as the transparent electrode film 300, it is possible to decrease light loss due to total reflection compared to when conducting polymer and conductive oxide are used. Since a graphene electrode is formed as a thin film having a thickness of about 10 nm or less, it is possible to ignore an optical effect. The light generated at the organic light emitting layer 400 is transmitted to the light scattering layer 200 without optical loss. As such, it is possible to maximize a light extraction effect by using the graphene.

Figure 7:
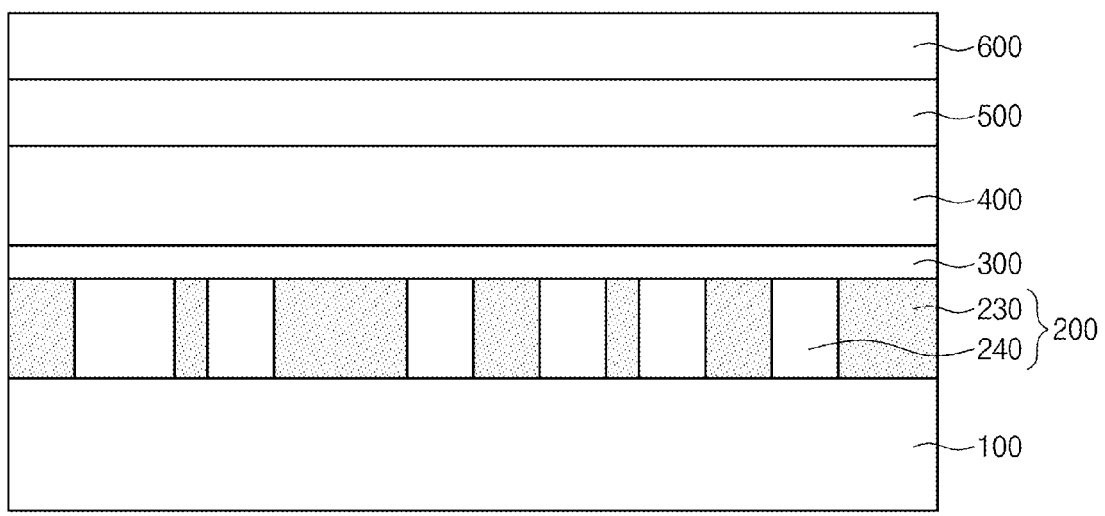

Referring to FIG. 7, the organic light emitting layer 400, the electrode 500, and the protective layer 600 may be sequentially formed on the transparent electrode film 300. The organic light emitting layer 400 may be formed by using a chemical vapor deposition (CVD), sputtering, E-beam evaporation technique or thermal evaporation technique. The organic light emitting layer 400 may generate light through the recombination of holes supplied from the transparent electrode film 300 and electrons supplied from the electrode 500. The light generated from the organic light emitting layer 400 may be partially or totally reflected by the substrate 100 to be guided into the transparent electrode film 300 and the organic light emitting layer 400. The light guided into the organic light emitting layer 400 may not be emitted to the substrate 100.

The electrode 500 may be a cathode. The electrode 500 may receive a voltage from the outside to supply an electron to the organic light emitting layer 400. The electrode 500 may transmit light generated from the organic light emitting layer 400 or reflect the light to the transparent electrode film 300.

The protective layer 600 protects the organic light emitting layer 400. The protective layer 600 may be formed to cover the OLED 1.

According to an embodiment of the present invention, it is possible to increase the light extraction efficiency of the OLED. Since planarization is performed by the transferring of the transparent electrode film onto the nano structure without a planarization layer process and the OLED is manufactured thereon, it is possible to decrease light loss due to a planarization layer. It is possible to increase the light extraction efficiency by the closer the distance between the organic light emitting layer 400 and the light scattering layer 200.

According to an embodiment of the present invention, since the transparent electrode film is manufactured by the transferring of at least one of 2-dimensionally formed graphene, molybdenum disulfide ($MoS_2$) and tungsten sulfide ($WS_2$) onto the nano structure, it is possible to decrease light loss due to total reflection compared to when the transparent electrode film is manufactured by the transferring of conducting polymer and conductive oxide.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An organic light emitting diode (OLED) comprising:
    a substrate;
    a light scattering layer having an uneven shape on the substrate;
    a transparent electrode film provided directly on and in contact with the light scattering layer;
    an organic light emitting layer on the transparent electrode film; and
    an electrode on the organic light emitting layer;
    wherein the light scattering layer comprises nano structures and air gaps between the nano structures.

2. The organic light emitting diode (OLED) of claim 1, wherein widths of the nano structures are about 50 nm to about 3000 nm and distances between the nano structures are about 50 nm to about 3000 nm.

3. The organic light emitting diode (OLED) of claim 1, wherein the transparent electrode film comprises at least one of conducting polymer, conductive oxide, carbon-based substance and metallic substance.

4. The organic light emitting diode (OLED) of claim 3, wherein the conducting polymer comprises at least one of poly (3,4-ethylenedioxythiophene), poly (4-styrenesulfonate), polyacetylene, poly (p-Phenylene), polythiophene, poly (ethylenedioxythiophene), polypyrrole, poly (p-phenylene vinylene), poly (thienylene vinylene), polyaniline, polyisothianaphthene, and poly (p-phenylene sulfide).

5. The organic light emitting diode (OLED) of claim 3, wherein the conductive oxide comprises at least one of indium tin oxide (ITO) and indium zinc oxide (IZO).

6. The organic light emitting diode (OLED) of claim 1, wherein the transparent electrode film comprises at least one of graphene, molybdenum disulfide ($MoS_2$) and tungsten sulfide ($WS_2$).

* * * * *